United States Patent
Ringsrud (10) Patent No.: US 9,541,581 B2
(45) Date of Patent: Jan. 10, 2017

(54) FLEXIBLE CURRENT SENSOR

(71) Applicant: Fluke Corporation, Everett, WA (US)

(72) Inventor: Paul Andrew Ringsrud, Langley, WA (US)

(73) Assignee: Fluke Corporation, Everett, WA (US)

( * ) Notice: Subject to any disclaimer, the term of this patent is extended or adjusted under 35 U.S.C. 154(b) by 67 days.

(21) Appl. No.: 14/524,886

(22) Filed: Oct. 27, 2014

(65) Prior Publication Data

US 2016/0116506 A1   Apr. 28, 2016

(51) Int. Cl.
  *G01N 27/82* (2006.01)
  *G01R 15/20* (2006.01)
  *G01R 19/00* (2006.01)
  G01R 15/12 (2006.01)

(52) U.S. Cl.
  CPC ........... *G01R 15/202* (2013.01); *G01R 15/205* (2013.01); *G01R 15/207* (2013.01); *G01R 19/0092* (2013.01); *G01R 15/12* (2013.01)

(58) Field of Classification Search
  CPC ..... G01N 27/82; G01N 27/9046; H01Q 11/12
  See application file for complete search history.

(56) References Cited

U.S. PATENT DOCUMENTS

| | | | | |
|---|---|---|---|---|
| 3,983,521 A * | 9/1976 | Furuto | ............... | H01L 39/14 |
| | | | | 174/125.1 |
| 4,327,244 A * | 4/1982 | Horvath | ............. | H01B 12/02 |
| | | | | 174/125.1 |
| 4,558,276 A | 12/1985 | Comeau et al. | | |
| 7,205,947 B2 * | 4/2007 | Parsche | ............... | H01Q 7/04 |
| | | | | 343/742 |
| 8,203,328 B2 * | 6/2012 | Bose | ............... | G01R 1/22 |
| | | | | 324/117 H |
| 8,461,824 B2 * | 6/2013 | Ausserlechner | ..... | G01R 15/207 |
| | | | | 324/117 R |
| 9,007,077 B2 * | 4/2015 | El-Essawy | ........... | G01R 15/205 |
| | | | | 324/117 H |
| 2013/0049750 A1 * | 2/2013 | He | ........... | G01R 15/205 |
| | | | | 324/252 |
| 2013/0241534 A1 * | 9/2013 | Schaerrer | ........... | G01R 15/202 |
| | | | | 324/117 H |

(Continued)

FOREIGN PATENT DOCUMENTS

| | | |
|---|---|---|
| CN | 1570654 A | 1/2005 |
| EP | 2 693 222 A1 | 2/2014 |
| JP | 06174753 A | 6/1994 |

OTHER PUBLICATIONS

Extended EP Search Report for EP 15191726.7, mailing date Apr. 5, 2016, 8 pages.

*Primary Examiner* — Vinh Nguyen
*Assistant Examiner* — Alvaro Fortich
(74) *Attorney, Agent, or Firm* — Seed IP Law Group LLP (57) ABSTRACT

Apparatus and methods for measuring current flowing through a conductor include a device comprised of a magnetically conductive loop having a plurality of strands and a magnetic field sensor. Each strand has a magnetically conductive material. The strands are configured to pass a magnetic field to a first magnetic field sensor that is positioned adjacent to an end of the first plurality of strands. The plurality of strands may be arranged in various patterns that allow the magnetically conductive loop to be more bendable or flexible than a current-clamp device.

23 Claims, 6 Drawing Sheets

(56) References Cited

U.S. PATENT DOCUMENTS

2014/0062459 A1* 3/2014 El-Essawy ........... G01R 15/205
  324/117 R
2014/0177672 A1* 6/2014 Davis .................... A46B 9/028
  374/152

* cited by examiner

FLEXIBLE CURRENT SENSOR

BACKGROUND

Typical non-contact current sensors capable of measuring direct current (DC) utilize clamp-type or jaw-type sensors having a rigid clamp positionable around an electrical component for measurement. A motor opens and closes the jaws of the clamp and aligns the jaws. Valid measurements require accurate jaw alignment.

Opening the jaws requires a large physical space. In addition, locating a clamp sensor around an electrical component in an electrical panel or other tight space can be awkward or cumbersome for a technician and may cause damage to the electrical component being measured or to nearby components. Vibrations from nearby heavy machinery may exacerbate these problems. Clamp sensors are typically heavier than a standard measurement tool because the jaws include large pieces of iron and a motor for opening, closing, and aligning the jaws.

Rogowski coils are current sensors that are lighter and more flexible than clamp-type current sensors. Rogowski coils are easier to use in tight spaces than most clamp sensors; however, Rogowski coils are not suitable for measuring DC current. A device capable of measuring DC and having a lighter weight and less rigid form factor than a clamp-type meter is desired.

SUMMARY

The following summary introduces a selection of concepts in a simplified form that are further described below in the Detailed Description. This summary is not intended to identify key features of the claimed subject matter, nor is it intended to be used as an aid in determining the scope of the claimed subject matter.

In one or more aspects, a device provides for measuring electric current flowing through a conductor. The device includes a magnetically conductive loop having a first plurality of strands and a first magnetic field sensor. Strands of the first plurality of strands include a magnetically conductive material. Strands of the plurality of strands may have a layer outside of the magnetically conductive layer that includes an insulator material. The strands are configured to pass a magnetic field to a first magnetic field sensor positioned adjacent to an end of the first plurality of strands. The magnetic field passed by the strands may be indicative of the electric current flowing through the conductor. In some embodiments, the first magnetic field sensor is configured to output a signal indicative of the electric current flowing through the conductor based on the magnitude of the magnetic field measured by the first magnetic field sensor.

In some embodiments, the device further comprises a coil that wraps around the loop and a driver circuit that is coupled to the coil and to the magnetic field sensor. The driver circuit is configured to generate an electric current that substantially nullifies the first magnetic field, wherein the electric current generated by the driver circuit is indicative of the electric current flowing through the conductor.

In some embodiments, the first magnetic field sensor is configured to output a signal indicative of the electric current flowing through the conductor based on the magnitude of the magnetic field sensed by the first magnetic field sensor. In some embodiments, a first bundle of strands includes the first plurality of strands, and the first plurality of strands are arranged such that they pass through an inner portion and an outer portion of the first bundle at least once over a length of the magnetically conductive loop. In some embodiment, the strands may be located about the same amount, on average, in an inner portion and an outer portion for a length of the first bundle. The strands may alternate from being in an inner portion and in an outer portion of the first bundle such that the strands are in the inner portion for about the same amount of length as the strands are in the outer portion of the first bundle. In some embodiments, the first plurality of strands are twisted.

In some embodiments, the device for measuring the flow of electric current may also include a fastening device configured to open and close the magnetically conductive loop. The fastening device may be configured to overlappingly position the first plurality of strands with a sensing element of the first magnetic field sensor. In some embodiments, the device may also include a second plurality of strands that includes a second bundle of strands. The fastening device may be configured to overlappingly position ends of the first and second bundles of strands with a sensing element of the first magnetic field sensor. The magnetically conductive loop may further include a second magnetic field sensor, wherein the first magnetic field sensor and the second magnetic field sensor are positioned across the magnetically conductive loop from one another.

In some embodiments, the inner portion of the first plurality of strands includes a nickel-iron alloy having a magnetic permeability of at least $5.0*10^{-3}$ H/m. In some embodiments, the inner portion of the first plurality of strands includes a mu-metal. The mu-metal may have a magnetic permeability of at least $2.5*10^{-3}$ H/m. The first magnetic field sensor may include at least one of a Hall Effect sensor, a flux gate, an anisotropic magnetoresistor sensor, and a giant magnetoresistor sensor. In some embodiments, the first plurality of strands is flexible. The electric current flowing through the conductor may be a direct current. In some embodiments, the device further includes a torroidal-shaped coil configured to be positioned around the magnetically conductive loop.

In another aspect, the present disclosure provides a method of measuring a current flowing through a conductor. The method includes passing a magnetic field from an end of a plurality of magnetically conductive strands of a magnetically conductive loop to a magnetic field sensor positioned adjacent to the end of the plurality of magnetically conductive strands. The method may include outputting a signal from the magnetic field sensor indicative of the electric current flowing through the conductor based on the magnitude of the magnetic field sensed by the magnetic field sensor. The method may further include generating an electric current through a coil wrapped around the magnetically conductive loop to substantially nullify the first magnetic field, wherein the electric current generated by the driver circuit to substantially nullify the first magnetic field is indicative of the electric current flowing through the conductor. In some embodiments, strands of the magnetically conductive strands have an outer layer of insulator material.

In some embodiments, the method further includes, prior to said passing of the magnetic field to the magnetic field sensor, positioning the magnetically conductive loop around the conductor and aligning the end of the plurality of insulated magnetically conductive strands with a sensing element of the magnetic field sensor by closing the magnetically conductive loop with a fastening device.

In yet another aspect of the present disclosure, a system for measuring current flowing through a conductor is provided. The system includes a measurement device configured to be couplable to the device for measuring electric current flowing through a conductor, and a Rogowski coil. The measurement device is configured to output a measured current value from one of the device and the Rogowski coil.

DESCRIPTION OF THE DRAWINGS

The foregoing aspects and many of the attendant advantages of this invention will become more readily appreciated as the same becomes better understood by reference to the following detailed description, when taken with the accompanying drawings, wherein.

DETAILED DESCRIPTION

The detailed description set forth below in connection with the appended drawings, where like numerals reference like elements, describes various embodiments of the disclosed subject matter and is not intended to represent the only embodiments. Each embodiment described in this disclosure provides merely an example or illustration that should not be construed as preferred or advantageous over other embodiments. The illustrated examples provided are not intended to be exhaustive or to limit the claimed subject matter to the precise forms disclosed.

The following discussion provides examples of systems, apparatus, and methods that relate to a flexible current sensor capable of measuring current flowing through a conductor without making contact with the conductor. In various embodiments, a flexible current sensor may have a similar size, shape, and appearance as a flexible loop of a Rogowski coil. Unlike a Rogowski coil, however, the current sensor described herein can sense direct current (DC). In some embodiments, the current sensor may further be capable of sensing alternating current (AC). The current sensor senses a flow of electrical current in a similar manner as a clamp or jaw-type current sensor but uses a different magnetic core.

Figure 1:
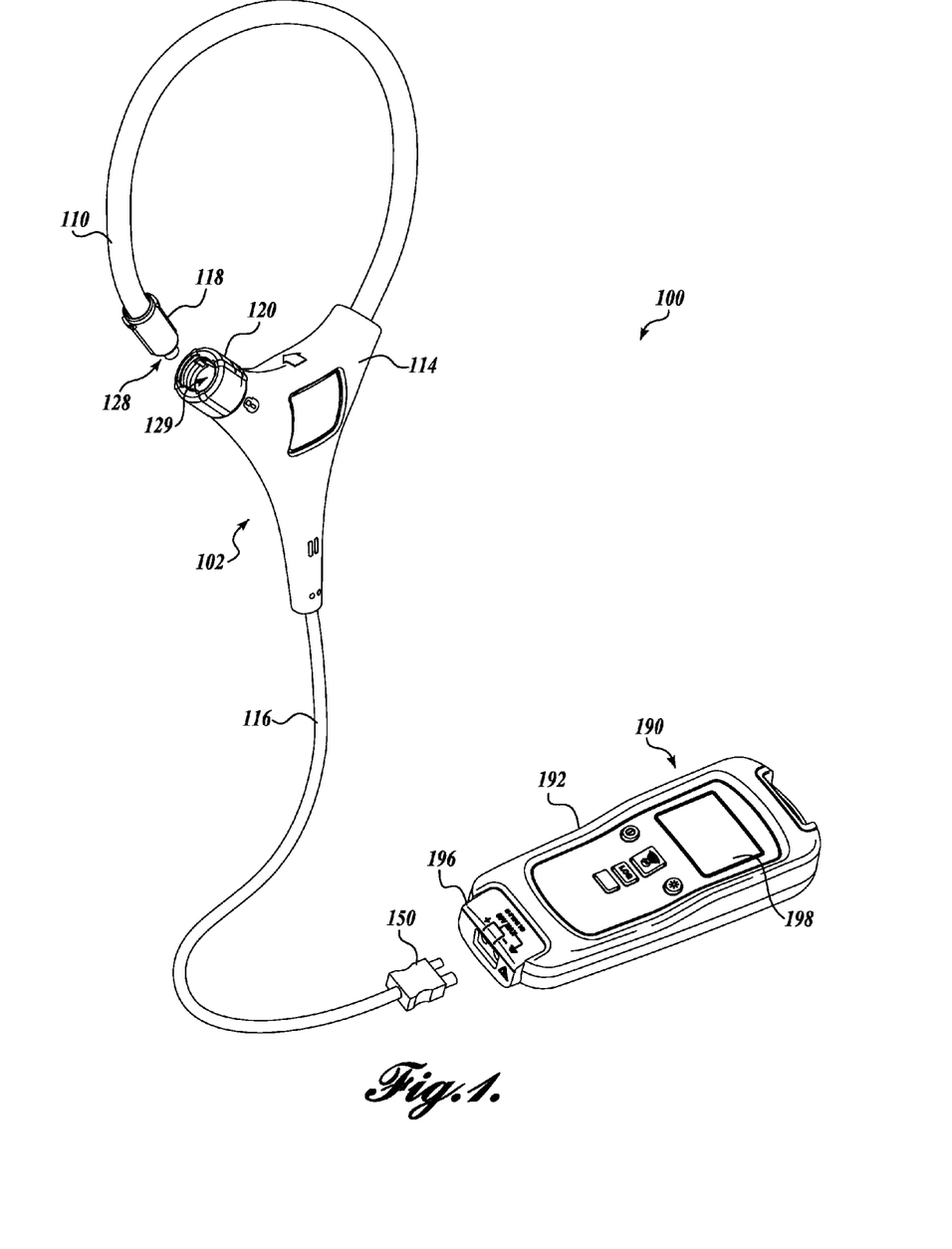
FIG. 1 is an example of a current measurement system having a loop that is open, in accordance with one or more embodiments of the present disclosure.

FIG. 1 shows current measurement system 100 having a current sensor 102 and a measurement device 190. The current sensor 102 includes a loop 110 having a flexible portion. The loop 110 includes a magnetically conductive material or "magnetic core." The magnetically conductive material includes a plurality of magnetically conductive strands. The strands, and therefore the loop 110, may be flexible or bendable. The strands may include an outer layer of insulator material that helps insulate the strands from one another. Rather than using a heavy, rigid jaw that opens and closes with a motor, the current sensor 102 uses the loop 110 to sense the flow of electrical current in a conductor. In some embodiments, the loop may be opened and closed such that it may be placed around a conductor having a current without interrupting the current.

As discussed in more detail herein, the plurality of flexible magnetically conductive strands in the loop 110 may be woven, braided, twisted, or arranged in patterns. The loop 110 also includes at least one magnetic field sensor and a signal cable 116 that may include a flexible portion. The signal cable 116 may be coupled to one or more components of the loop 110, such as the one or more magnetic field sensors.

The magnetic field sensor may be placed in a gap between magnetically conducting material. Various types of magnetic field sensors may be used. For example, the magnetic field sensor may include a Hall Effect sensor. The loop 110 may include a pendant 114 that contains magnetic field sensor. The pendant 114 may protect the magnetic field sensor.

The current sensor 102 is coupled or couplable to the measurement device 190. The signal cable 116 may extend from the loop 110 and may include a coupler 150 that is input into a housing 192 of the measurement device 190. The measurement device 190 includes measurement circuitry capable of receiving an output provided by the current sensor 102, calculating a current value, and presenting the calculated current values to a user. The measurement circuitry of the measurement device 190 may be used for other functions as well, such as receiving inputs from other sensors and calculating measurements. The measurement device 190 may be embodied as various electronic measurement devices, such as a multimeter, for example. Measured values representing current flow sensed by the current sensor 102 may be displayed on the display 198 of the measurement device 190.

Besides being coupled or couplable to the current sensor 102, the measurement device 190 may be coupled or couplable to a Rogowski coil or other sensor. For example, the coupler 150 may be substantially the same as a coupler from a Rogowski coil, and either the current sensor 102 or a Rogowski coil may be input into a port 196 in the housing 192 of the measurement device 190. In some embodiments, the measurement device 190 may have multiple input ports. In some embodiments, the measurement device 190 may be couplable or coupled to a Rogowski coil and the current sensor 102 at the same time. The measurement device 190 may be configured to selectively display measured values input from either the current sensor 102 or a Rogowski coil in response to a user input to the measurement device 190. Such embodiments may allow a technician to carry the measurement device 190 and use it with the current sensor 102 and other sensors, rather than carrying a separate measurement device for each sensor. For example, the technician may use the measurement device 190 with a Rogowski coil to measure AC currents and the current sensor 102 to measure AC currents, respectively. This may reduce the size and weight of equipment that a technician must carry around the worksite and may also reduce the number of trips back-and-forth at a worksite to swap measurement devices.

Still referring to FIG. 1, the loop 110 of the current sensor 102 may include a first end 128 having a fastener element 118. The loop 110 may have a fastener receiver 120 attached at or near a second end 129 of the loop 110. The fastener element 118 and the fastener receiver 120 are configured to mate with one another. For example, the fastener element 118 and the fastener receiver 120 may comprise a quarter turn-type fastener and a compatible fastener receiver, respectively. At least one magnetic field sensor may be positioned at one of the first end 128 and the second end 129, and magnetically conductive material may be positioned at the other one of the first end 128 and the second end 129.

The magnetically conductive material may provide a magnetic field to a sensing element of the at least one magnetic field sensor. In some embodiments, the ends of the plurality of strands of magnetically conductive material in the loop 110, such as the strands are positioned at one of the first end 128 and the second end 129, and a magnetic field is provided to the magnetic field sensor by the ends of the plurality of strands of magnetically conductive material. A gap may exist between a magnetic field sensor and the magnetically conductive material, and the magnetic field from the magnetically conductive material may pass across the gap.

Consistent and precise positioning of the loop 110 and the magnetic field sensor may help achieve accurate and reliable measurements. In some embodiments, the gap between the magnetically conductive material and the magnetic field sensor is minimized. Minimizing the gap may reduce field loss and interference from external fields. In some embodiments, mating of the fastener element 118 and the fastener receiver 120 automatically positions or aligns the magnetically conductive material with the magnetic field sensor such that a magnetic field is focused through the magnetic field sensor. Mating between the fastener element 118 and the fastener receiver 120 may position the first end 128 and the second end 129 with respect to one another, align a magnetic field provided by the strands and the magnetic field sensor, and/or minimize the gap between the magnetically conductive material and the magnetic field sensor.

Figure 2:
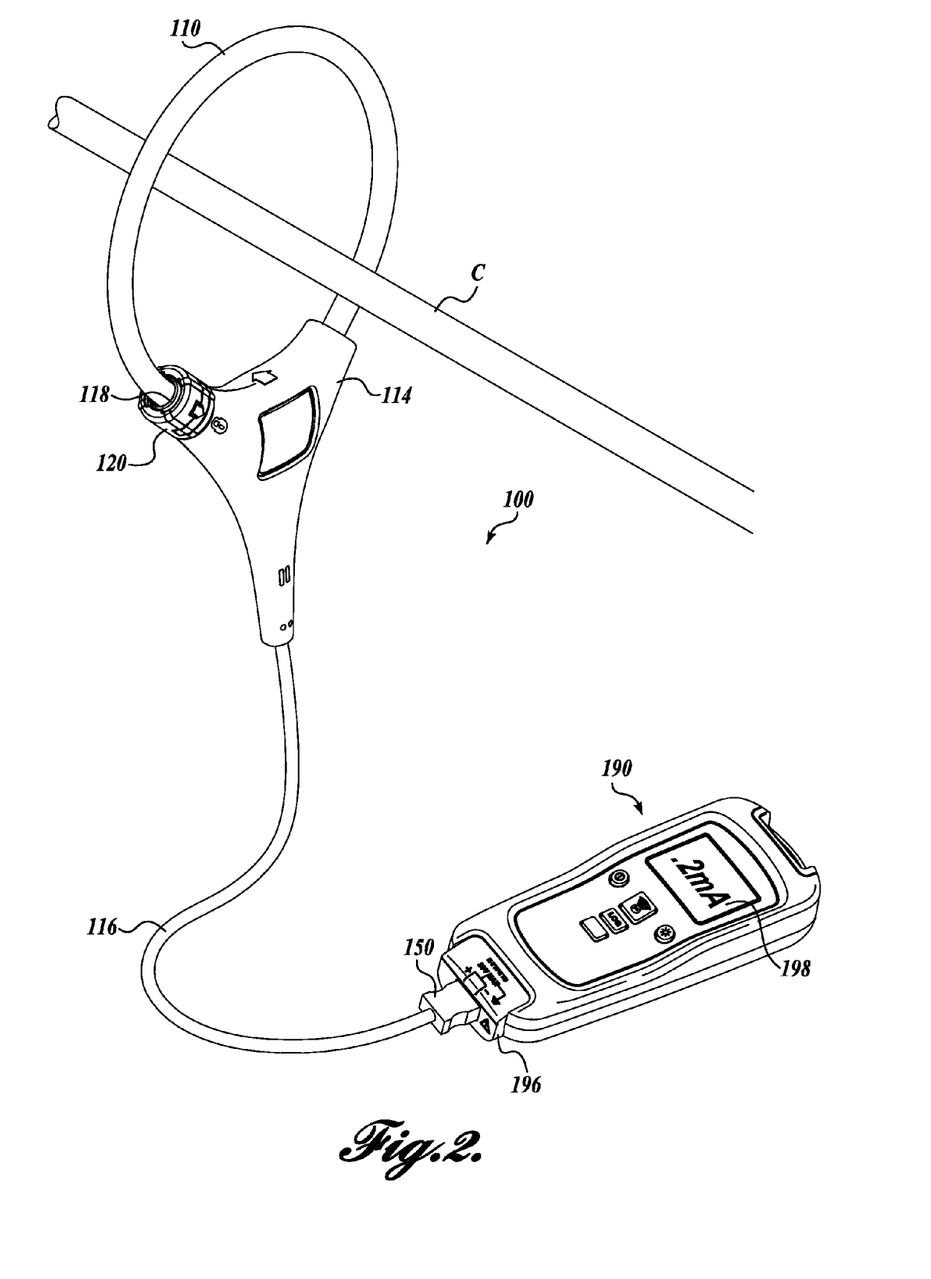
FIG. 2 is an example of the current measurement system of FIG. 1 with the loop closed around a conductor and is measuring a current flowing through the conductor, in accordance with one or more embodiments of the present disclosure.

FIG. 2 shows the current sensor 102 in operation. The current sensor 102 is connected to the measurement device 190 via the signal cable 116. The loop 110 is closed and is located around a conductor C that has a DC current flowing therethrough. The fastener element 118 and the fastener receiver 120 are mated, and the magnetically conductive material, such as the strands, and the magnetic sensor are aligned via the mating. A measured current value of 0.2 mA is displayed on the display 198.

Figure 3:
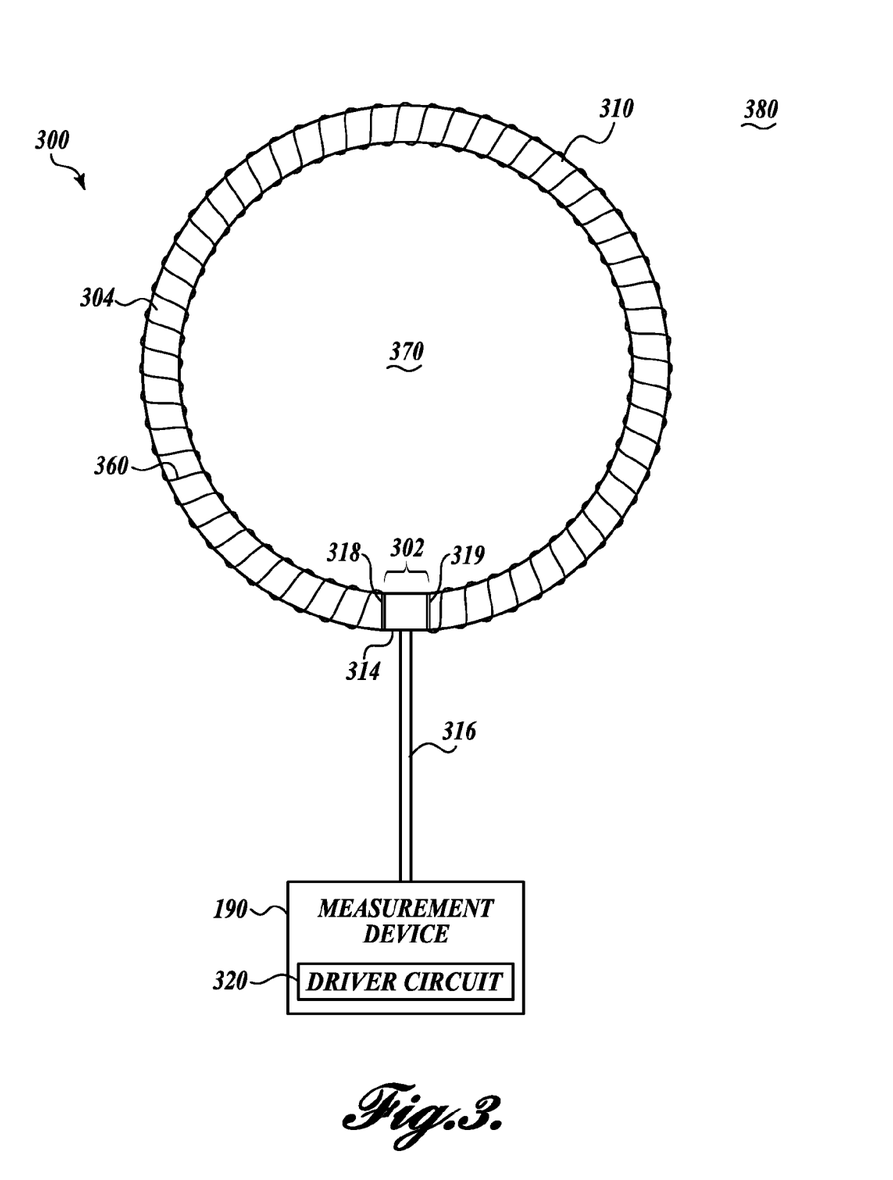
FIG. 3 is a block diagram of a current sensor having a loop that includes a magnetic field sensor located between a magnetically conductive section and a coil, in accordance with one or more embodiments of the present disclosure.

FIG. 3 shows a block diagram of a current sensor 300 having a loop 310 that includes a magnetic field sensor 314 and a magnetically conductive section 304, which may also be referred to as a "magnetic core." The current sensor 300 may be suitable for use with the system 100 shown in FIG. 1. As shown in FIG. 3, the current sensor 300 is closed. The magnetically conductive section 304 may have a first end 318 and a second end 319. The magnetically conductive section 304 includes a plurality of strands of magnetically conductive materials. In some embodiments, the strands of magnetically conductive material extend in the loop 310 from the first end 318 to the second end 319. The loop 310 is coupled to the measurement device 190 via a signal cable 316. A gap 302 may be defined within the magnetically conductive section 304 while the loop 310 is in the closed position.

The magnetic field sensor 314 is disposed in the gap 302, and may be attached to one of the first end 318 and the second end 319. The other of the first end 318 and the second end 319 is positioned adjacent to the magnetic field sensor 314. The magnetic field sensor 314 is configured to receive a magnetic field from the other of the first end 318 and the second end 319. The magnetic field may be concentrated or focused by the magnetically conductive section 304. The current sensor 300 may be configured as an "open loop" sensor. The magnetic field sensor 314 may provide an output signal indicative of a current flowing through a circuit component, such as a wire or other conductor encircled by the loop 310 (e.g., as illustrated in FIG. 2). For example, the magnetic field sensor 314 may be a Hall Effect sensor, and Hall voltage of the sensor may be provided as an output signal to a measurement device.

In some embodiments, the current sensor 300 includes a torroidal-shaped coil 360 that is external to and wraps around the magnetically conductive section 304. The coil 360 is electrically conductive and may be coupled to the signal cable 316. The coil 360 may be driven by a driver circuit 320 containing an amplifier such that a current flows through the coil 360. The current flowing through the coil 360 may be provided by a source included with or attached to the measurement device 190, for example. In some embodiments, the current sensor 300 is "closed loop." The current sensor 300 uses the driver circuit 320 to generate a current through the coil 360 to substantially nullify the magnetic field from the electrical current of the conductor by generating substantially the same magnitude magnetic flux in the opposite direction as the magnetic field from the electrical current of the conductor. The current through the coil 360 may provide for the magnetic core and sensor to be at the same operating point and may reduce undesirable effects from non-linearity of the sensor or core. The current through the coil 360 may be proportional to the current through the conductor being measured. The current generated by the driver circuit 320 may be indicative of the electrical current flowing through the conductor.

Figure 4:
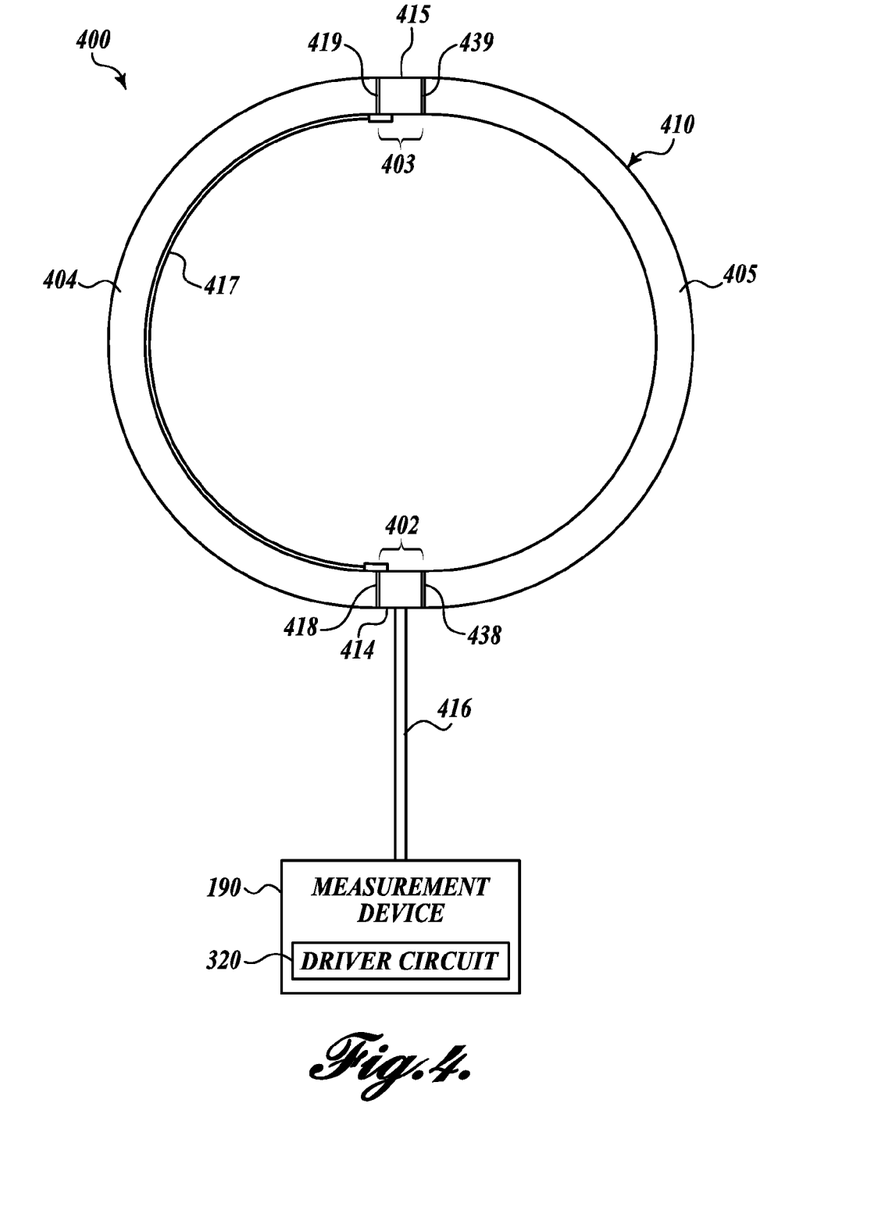
FIG. 4 is a block diagram of a current sensor having a loop that includes at least two magnetic field sensors and two separate magnetically conductive sections, in accordance with one or more embodiments of the present disclosure.

FIG. 4 shows a block diagram of a current sensor 400 having a loop 410, a first magnetic field sensor 414, and a second magnetic field sensor 415. The current sensor 400 may be suitable for use with the current measurement system 100 shown in FIG. 1. The current sensor 400 is similar to current sensor 300, except it has two magnetic field sensors rather than a single magnetic field sensor. The loop 410 includes a first magnetically conductive section 404 and a second magnetically conductive section 405. At least one of the first magnetically conductive section 404 and the second magnetically conductive section 405 includes a plurality of strands of magnetically conductive material. The loop 410 includes a first gap 402 and a second gap 403. The first magnetically conductive section 404 and the second magnetically conductive section 405 are thus, separate from one another. A first end 418 of the first magnetically conductive section 404 and a first end 438 of the second section 405 define the first gap 402.

The first magnetic field sensor 414 is disposed in the first gap 402, and is configured to sense a magnetic field provided by the magnetically conductive material of the first magnetically conductive section 404 and the second magnetically conductive section 405. A second end 419 of the first magnetically conductive section 404 and a second end 439 of the second magnetically conductive section 405 define the second gap 403. The second magnetic field sensor 415 is disposed in the second gap 403. To reduce field loss and interference from external fields, space between the magnetic field sensors 414 and 415, and the ends 418, 419, 438, and 439 of the loop 410, respectively may be minimized. For example, ends 419 and 439 should be positioned close to or attach to the second magnetic field sensor 415 during operation. Using two magnetic field sensors that are positioned across the internal space of the loop from one another may compensate for the external fields. By canceling or reducing the impact of magnetic influences from the external space 380, the coil 360 may help reduce measurement inaccuracies. The current sensor 400 may be open loop or closed loop. For example, although not shown, a current driven through a torroidal-shaped coil 360 as shown in FIG. 3 may also be used with the current sensor 400 to reduce non-linearities in the loop 410.

The loop 410 may include an insulator material layer. The first magnetically conductive section 404, the first magnetic field sensor 414, the second magnetically conductive section 405, and the second magnetic field sensor 415 may be covered by the insulator material layer. The length of the first magnetically conductive section 404 and the length of the second magnetically conductive section 405 may be substantially the same. In some embodiments, the first magnetic field sensor 414 and the second magnetic field sensor 415 may be located across the internal space 470 from one another. The loop 410 may further include a fastener. The loop 410 may be opened and closed, and may be placed around or encircle an electrical component or conductor to be measured. The second magnetic field sensor 415 may be coupled to the signal cable 416 via a cable 417.

Other embodiments are possible. For example, in addition to the first magnetically conductive section 404 and the second magnetically conductive section 405, the loop 410 may include one or more additional separate sections of a magnetically conductive material. Additional magnetic field sensors may be disposed in gaps between the sections of magnetically conductive material. In some embodiments, the current sensors 102 or 400 include a coil similar to the coil 360 shown in FIG. 3. Also, the current sensors 102, 300, and 400 may use different magnetic field sensors. For example, the magnetic field sensors may include one or more of a Hall Effect sensor, a flux gate, an anisotropic magnetoresistor (AMR) sensor, or a giant magnetoresistance (GMR) sensor. The magnetic field sensor may include other devices capable of measuring an intensity of a magnetic field in the gaps.

Figure 5:
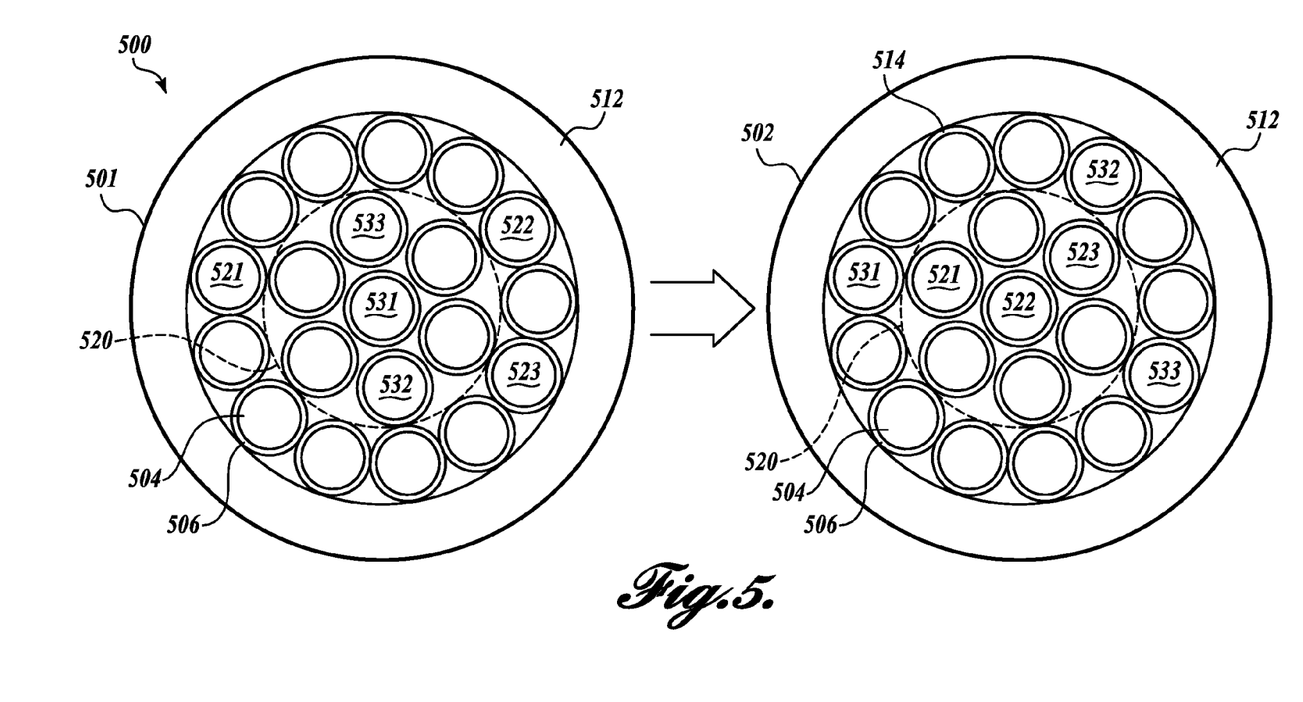
FIG. 5 illustrates two cross-sectional views of a bundle of magnetically conductive strands at different lengthwise positions along the bundle, in accordance with one or more embodiments of the present disclosure.

FIG. 5 shows cross-sectional views of a bundle 500 of magnetically conductive strands at a first location 501 and a second location 502 located a lengthwise distance from the first location 501. The bundle 500 may be suitable for use with the system 100 shown in FIG. 1. The bundle 500 includes strands 521, 522, 523, 531, 532, and 533. The strands are arranged such that their relative positions with respect to one another change over a length of the bundle. The strands comprise an inner portion 504 that includes a magnetically conductive material. The strands may include an outer portion 506 having an insulator material for insulating the strands from one another. Strands with and without the outer portion of the insulator material are suitable for various embodiments of this disclosure, such as current sensors 102, 300, and 400. Using multiple strands minimizes eddy effect that can cause currents to form in the sensor, causing heating of the sensor and limiting its ability to measure the magnetic field. Using a multiple of strands may also allow for the magnetically conductive sections to be more flexible or bendable than a current-clamp device.

The bundle 500 may have a rounded or a circular cross-sectional shape, for example. In some embodiments, the shape of the bundle is congruent to the shape of the sense element of the magnetic field sensor. When aligned, the substantial magnetic field from the bundle is provided to the magnetic field sensor. In one embodiment, the bundle 500 includes approximately twenty strands, though different quantities of strands may be used. The strands may be arranged such that they provide a magnetic field across a gap, such as the first gap 402 shown in FIG. 4. The bundle 500 may include an outer layer 512 that may include an insulator material for protecting the strands from interference or damage.

As illustrated in FIG. 5, the bundle 500 has an outer portion of strands that is external to a line 520 and an inner portion of strands that is internal to the line 520. At the first location 501, strands 521, 522, and 523 are in the inner portion, and strands 531, 532, and 533 are in the outer portion of the bundle 500. As shown, the position of the strands changes relative to one another along the length of the bundle 500. For example, at the second location 502, strands 521, 522, and 523 are in the inner portion and strands 531, 532, and 533 are at the outer portion. In some embodiments, the strands alternate between being in the outer section and the inner section of the bundle 500 such that strands pass through an inner portion and the outer portion of the bundle over a length of the bundle 500. In some embodiments, the strands alternate between being in the outer section and the inner section of the bundle 500 multiple times over a length of the bundle 500.

In some embodiments, the strands alternate from being in an inner portion and in an outer portion of the bundle such that the strands are in the inner portion about the same amount of length as the strands are in the outer portion of a bundle for a length of the bundle. In some embodiments, the strands may be located the same amount, on average, in an inner portion and an outer portion for a length of a bundle. Various patterns may be used in arranging the strands. In some embodiments, the proportion of overall length that each strand is in the outside portion of a bundle is about the same. In some embodiments, the proportion of overall length that each strand is at the inner portion of a bundle is about the same. These patterns may provide electrical and mechanical advantages such as allowing for a loop in a current sensor, as described herein, to be durable and flexible. Various patterns of arranging strands and/or strand sizes may allow for the bundle to be resilient. Some patterns may allow the loop to be flexible and also resilient. Such properties provide significant advantages over existing clamp-type current sensors.

As discussed above in relation to FIG. 3, accurate and consistent positioning of the magnetically conductive material with respect to one or more magnetic field sensors can be important for providing accurate and consistent measurements. The distance between the ends of the strands and a magnetic field sensor may be minimized, and the strands may be aligned with the magnetic field sensor. Some magnetically conductive materials may not be as flexible as typical conductor materials, and some strands could stiffen and/or break with time and usage, causing a change in dimensions by a few thousands of an inch. Such a change in positioning of strands relative to a magnetic field sensor could cause inconsistent measurements. In some embodiments, a precise distance between strands and a magnetic field sensor is achieved by polishing the ends. In some embodiments, the ends of the strands are sealed with epoxy to help consistently maintain the locations of the strands after the strands have been bent.

Figure 6:
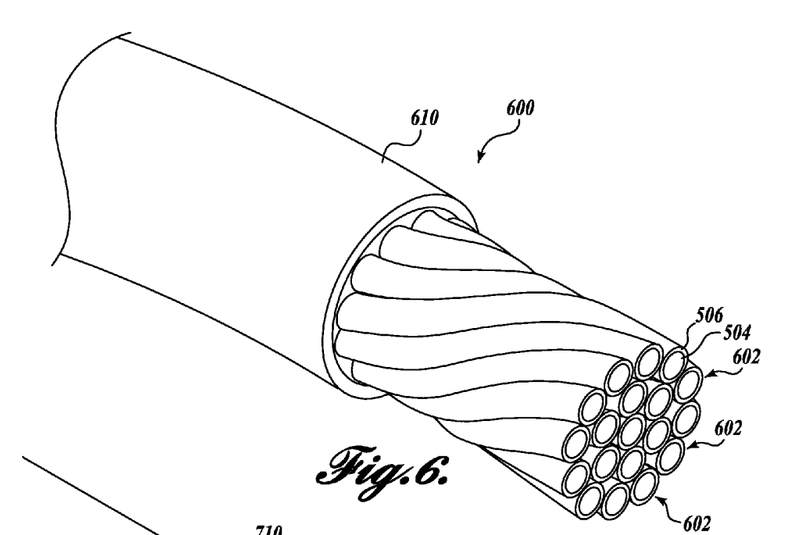
FIG. 6 is a bundle of magnetically conductive strands that have been twisted with respect to one another, in accordance with one or more embodiments of the present disclosure.

FIG. 6 shows a bundle 600 of twisted strands 602. Twisted strands may provide improved properties related to flexibility and resiliency compared to strands that are straight. As shown in FIG. 6, the strands are twisted such that their positions change along a lengthwise direction of the bundle. The bundle 600 may have an outer layer 610 that may include an insulator material.

Figure 7:
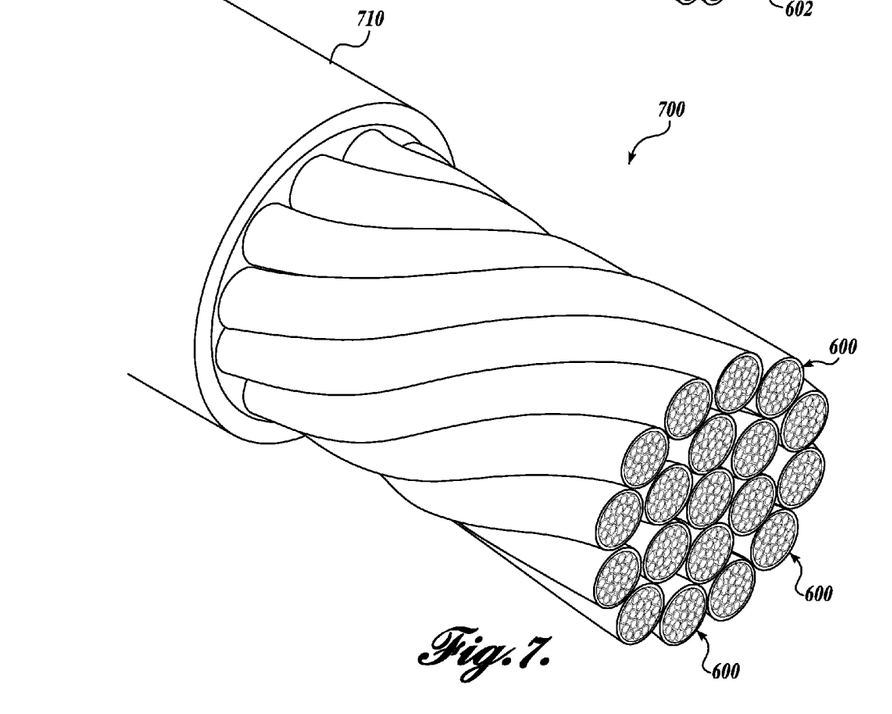
FIG. 7 is a bundle of magnetically conductive strands that includes a plurality of bundles of twisted strands, in accordance with one or more embodiments of the present disclosure.

FIG. 7 shows a bundle 700 made up of a plurality of bundles 600 of strands 602. As shown, the bundles 600 have been twisted along a lengthwise direction of the bundle 700. In some embodiments, the bundles 600 may be woven together. Bundles 600 may be arranged in similar patterns as discussed herein. The bundle 700 may have an outer layer 710 that may include an insulator material. The outer layer 710 may help to protect against short circuits or external interfering influences.

Various combinations of patterns of strands and bundles may be utilized with embodiments of the current sensors disclosed herein. Various winding techniques may arrange the strands and/or bundles of strands. In some embodiments, Litz winding techniques may be used such that the strands are arranged in a Litz pattern. For example, the strands may include a magnetically conductive material, and be arranged similar to Round Type 2 wire by New England Wire Technologies.

The overall dimensions of the bundles 500, 600, and 700 may be varied. The bundles may be sized and configured such that an end of the bundle overlaps with a sensing element of a magnetic field sensor. For example, the number of strands included in the bundle and the shape of the bundle may be determined based on the size of the sensing element and the cross-sectional area of the strands, including the inner portion and the outer portion of the bundle. For example, for the end of the bundle to overlap with the sensing element of the magnetic field sensor, the surface area and dimensions of the sensing element may be such that a cross-sectional area at the end of the bundle is greater than an area of the sensing element of the magnetic field sensor so that magnetic fields from the strands in the bundle are sensed by the magnetic field sensor.

The magnetically conductive material in the embodiments of this disclosure may have a a magnetically permeability of at least $5.0 \times 10^{-3}$ H/m. A material having such magnetic permeability material will increase the magnetic field near the material, which may help to focus the magnetic field across a gap that includes the magnetic field sensor. Different magnetically conductive materials and insulator materials may be used in the inner portion 504 and the outer portion 506 of the strands, respectively. Increasing the magnetic permeability of the strands may increase the sensitivity of the current sensor, such as current sensor 102, 300, or 400. For example, the magnetically conductive material in the inner portion 504 of the strands may include a nickel-iron alloy, such as electrical steel.

In some embodiments, the magnetically conductive material of the strands includes a mu-metal. Mu-metals may have magnetic permeabilities of at least $2.5 \times 10^{*2}$ H/m. Examples of commercially available mu-metals include MuMETAL, Mumetall, and Mumetal2. Mu-metals may be formed into a thin wire. It is also desired that the strands comprise a material that is ductile and workable. A magnetic permeable material having good resiliency for the strands such that the bundle 500 does not yield or bend permanently when placed around an electrical component or conductor to be tested may provide significant advantages. Mu-metals strands have advantageous resiliency properties and are more ductile and workable than other nickel-iron alloys. Materials with a low loss tangent, such as electrical steel, may be used. Using materials with low loss tangent may provide improved accuracy and repeatability properties.

In operation, a magnetic field may be passed from an end of a plurality of insulated magnetically conductive strands of a magnetically conductive loop to a magnetic field sensor positioned adjacent to the end of the plurality of insulated magnetically conductive strands. A signal may be output by the magnetic field sensor that represents the current flowing through the electrical component or conductor being tested based on the magnetic field passed from the end of the plurality of strands.

In some embodiments, prior to passing the magnetic field to the magnetic field sensor, the magnetically conductive loop is positioned around the conductor. The end of the plurality of insulated magnetically conductive strands may be aligned with a sensing element of the magnetic sensor by closing the magnetically conductive loop with a fastening device.

It will be appreciated that various magnetically conductive strands, bundles, and patterns of arrangement, such as the bundles 500, 600, and 700 may be suitable for use in the magnetically conductive portion of the loop 110 in FIGS. 1 and 2, magnetically conductive section 304 of FIG. 3, and the first magnetically conductive section 404 and second magnetically conductive section 405 of FIG. 4.

Many alternatives to the patterns are possible. Braiding, weaving, twisting, and other patterns or arrangements of strands may provide mechanical and electrical advantages and may also provide for desirable magnetic properties when used in a current measurement system, such as the current measurement system 100 in FIG. 1. Braiding or weaving may allow for the length of individual strands and bundles to stay fixed as the loop 110 is flexed, which allows for the strands to be uniform at the end while the loop 110 is flexed. Lack of uniformity at the ends decreases measurement accuracy. If the first end 318 of the plurality of strands is not consistent when flexed, some of the strands or bundles may pull away from magnetic field sensor 314 when flexed. Various arrangements of strands may be used, such as the arrangements shown in FIGS. 5, 6, and 7. As mentioned earlier, in some embodiments, a bundle is formed by winding strands using a Litz winding method.

The number of strands in a bundle, the strand dimensions, the magnetically conducive materials of strands, and other strand properties may be varied. In some embodiments, a plurality of bundles 500 may be woven together. Weaving or braiding the strands may provide advantages. For example, the strands in the bundle 500 may be more flexible, durable and able to withstand vibrations than straight wires. Multiple bundles 500 of strands may be braided together.

In the preceding description, numerous details were set forth to provide a thorough understanding of one or more embodiments of the present disclosure. It will be apparent to one skilled in the art, however, that many embodiments of the present disclosure may be practiced without some or all of the details. It will be appreciated that changes can be made in the various embodiments without departing from the spirit and scope of the disclosure. It will therefore be appreciated that embodiments of the present disclosure may employ any combination of the features described herein.

The embodiments of the invention in which an exclusive property or privilege is claimed are defined as follows:

1. A device for measuring electric current flowing through a conductor, the device comprising:
   a magnetically conductive loop that is positionable to surround the conductor, wherein the magnetically conductive loop includes a plurality of strands; and
   a magnetic field sensor that is positioned adjacent to an end of the plurality of strands to sense a magnetic field,
   wherein each strand of the plurality of strands comprises a magnetically conductive material, and
   wherein the plurality of strands is configured to pass to the magnetic field sensor a magnetic field that is indicative of an electric current flowing through the conductor.

2. The device of claim 1, wherein the magnetic field sensor is configured to output a signal indicative of the electric current flowing through the conductor based on a magnitude of the magnetic field sensed by the magnetic field sensor.

3. The device of claim 1, further comprising:
   a coil that wraps around the magnetically conductive loop; and
   a driver circuit that is coupled to the coil and to the magnetic field sensor,
   wherein the driver circuit is configured to generate an electric current that flows through the coil and substantially nullifies the magnetic field, and wherein the electric current generated by the driver circuit is indicative of the electric current flowing through the conductor.

4. The device of claim 1, wherein one or more strands of the plurality of strands have an outer layer of insulator material around the magnetically conductive material.

5. The device of claim 1, wherein the plurality of strands includes a bundle of strands, and
   wherein the strands in the plurality of strands are arranged such that they pass through an inner portion and an outer portion of the bundle of strands at least once over a length of the magnetically conductive loop.

6. The device of claim 5, wherein the strands in the plurality of strands are arranged such that the strands alternate from being in the inner portion and the outer portion of the bundle of strands, wherein the strands are in the inner portion of the bundle of strands for about the same amount of length of the magnetically conductive loop as the strands are in the outer portion of the bundle.

7. The device of claim 5, wherein the strands in the plurality of strands are arranged such that the strands are located about the same amount of length, on average, in the inner portion and the outer portion of the bundle of strands for a length of the bundle of strands.

8. The device of claim 1, wherein the strands in the plurality of strands are twisted.

9. The device of claim 1, further comprising a fastening device configured to open and close the magnetically conductive loop.

10. The device of claim 9, wherein the fastening device is configured to overlappingly position an end of the plurality of strands with a sensing element of the magnetic field sensor.

11. The device of claim 9, wherein the plurality of strands is a first plurality of strands, the device further comprising a second plurality of strands, wherein the fastening device is configured to overlappingly position ends of the first and second plurality of strands with a sensing element of the magnetic field sensor.

12. The device of claim 1, wherein the magnetic field sensor is a first magnetic field sensor, wherein the magnetically conductive loop further comprises a second magnetic field sensor that is positioned adjacent to an end of the plurality of strands to sense a magnetic field, and wherein the first magnetic field sensor and the second magnetic field sensor are positioned across the magnetically conductive loop from one another.

13. The device of claim 1, wherein an inner layer of the strands in the plurality of strands comprises a nickel-iron alloy having a magnetic permeability of at least $5*10^{-3}$ H/m.

14. The device of claim 13, wherein strands in the plurality of strands comprise a Mu-metal.

15. The device of claim 1, wherein the magnetic field sensor comprises at least one of a Hall Effect sensor, a flux gate, an anisotropic magnetoresistor sensor, and a giant magnetoresistance sensor.

16. The device of claim 1, wherein the plurality of strands is flexible.

17. The device of claim 1, wherein the plurality of strands is configured to pass to the magnetic field sensor a magnetic field that is indicative of direct current flowing through the conductor.

18. The device of claim 1, further comprising a toroidal-shaped coil configured to encircle the magnetically conductive loop to reduce non-linearity in at least one of the magnetic field sensor and the magnetically conductive loop.

19. A method of measuring a current flowing through a conductor, comprising:
   positioning a magnetically conductive loop around the conductor, wherein the magnetically conductive loop includes a plurality of magnetically conductive strands having an end positioned adjacent to a magnetic field sensor; and
   passing a magnetic field from the end of a plurality of magnetically conductive strands to the magnetic field sensor, wherein the magnetic field sensed by the magnetic field sensor is indicative of an electric current flowing through the conductor.

20. The method of claim 19, further comprising outputting a signal from the magnetic field sensor indicative of the current flowing through the conductor based on a magnitude of the magnetic field passed from the end of the plurality of magnetically conductive strands to the magnetic field sensor.

21. The method of claim 19, further comprising generating an electric current through a coil wrapped around the magnetically conductive loop to substantially nullify the magnetic field, wherein the electric current generated to substantially nullify the magnetic field is indicative of the electric current flowing through the conductor.

22. The method of claim 19, further comprising:
   prior to passing the magnetic field to the magnetic field sensor, aligning the end of the plurality of magnetically conductive strands with a sensing element of the magnetic field sensor by closing the magnetically conductive loop with a fastening device.

23. A system for measuring current flowing through a conductor, the system comprising the device of claim 1 and a measurement device couplable to the device of claim 1 and a Rogowski coil, wherein the measurement device is configured to output a current measurement representative of current flowing through the conductor based on a signal received from one of the device of claim 1 and the Rogowski coil.

* * * * *